United States Patent [19]

Hunt et al.

[11] Patent Number: 5,674,367
[45] Date of Patent: Oct. 7, 1997

[54] SPUTTERING TARGET HAVING A SHRINK FIT MOUNTING RING

[75] Inventors: Thomas Hunt, Peekskill; Paul S. Gilman, Suffern, both of N.Y.

[73] Assignees: Sony Corporation, Tokyo, Japan; Materials Research Corp., Orangeburg, N.Y.

[21] Appl. No.: 577,798

[22] Filed: Dec. 22, 1995

[51] Int. Cl.$^6$ .................................................. C23C 14/34
[52] U.S. Cl. ................................................ 204/298.12
[58] Field of Search ................................. 204/298.12

[56] References Cited

U.S. PATENT DOCUMENTS

| 4,198,283 | 4/1980 | Class et al. | 204/298.12 |
| 5,529,673 | 6/1996 | Strauss et al. | 204/298.12 |

FOREIGN PATENT DOCUMENTS 3030329  2/1982  Germany ..................... 204/298.12

*Primary Examiner*—Aaron Weisstuch
*Attorney, Agent, or Firm*—Pasquale Musacchio, Esq.; Peter C. Toto, Esq.; Jerry A. Miller

[57] ABSTRACT

A target assembly for use in a sputtering system used for forming a thin film on a substrate is disclosed. The target assembly includes a mounting element having an interior wall which defines an aperture. The target assembly further includes a target for providing material for forming the film on the substrate. In particular, the target is affixed within the mounting element by an interference fit between the aperture and the target. Furthermore, the mounting ring includes a groove for holding an O-ring which serves to maintain a vacuum in the sputtering system.

15 Claims, 4 Drawing Sheets

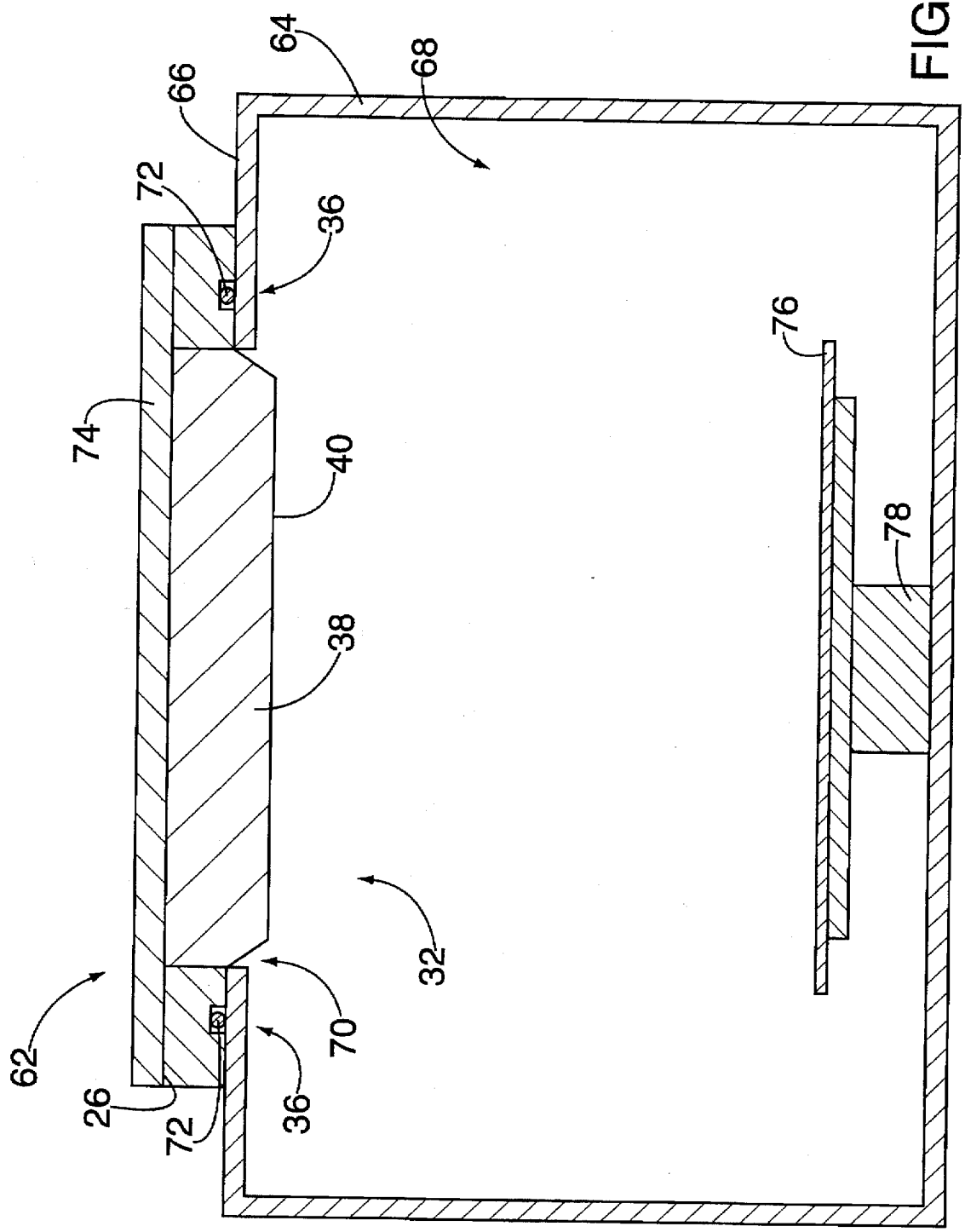

5,674,367

SPUTTERING TARGET HAVING A SHRINK FIT MOUNTING RING

FIELD OF THE INVENTION

The present invention relates to apparatus for sputtering thin films onto a substrate, and more particularly, to a sputtering target having a mounting ring which is shrink fit onto the sputtering target.

BACKGROUND OF THE INVENTION

A sputtering process is typically utilized in the manufacture of integrated circuits (ICs). This process includes the formation of a thin layer or film of metal on a substrate such as a silicon or a gallium arsenide wafer. A sputter deposition system which includes a chamber having a target assembly is utilized to implement the sputtering process. One type of target assembly includes a backing plate and a target having a sputtering surface from which material for forming the film is removed. In operation, a substrate which is to be sputtered is positioned within the chamber opposite the sputtering surface. Further, the chamber is maintained at a vacuum level suitable for sputtering and a process gas, such as argon, is introduced into the chamber between the sputtering surface and the substrate. A high DC or AC voltage is then applied to the target assembly to cause the formation of a plasma discharge having positively charged argon ions which bombard the sputtering surface. This causes target material to be removed from the sputtering surface, thus initiating a sputtering process wherein target material is deposited onto the substrate to form the film. Ultimately, the target material becomes depleted through use, at which time the target assembly is replaced.

A diffusion or solid state bonding process is used to form a bond which serves to affix the target to the backing plate. In particular, the bond is formed along the target and backplate interface and is perpendicular to a center axis of the target. However, this results in a relatively large bonding area, which increases the likelihood of structural failure. Further, the weight of the target is limited by the strength of the bond, which limits the thickness of the target and thus the usable life of the target assembly. This results in frequent shutdowns of the sputtering system in order to replace depleted target assemblies, which increases manufacturing costs. In addition, such bonding processes are complicated and require specialized equipment which also increases manufacturing costs. In another type of target assembly, a one piece configuration is used wherein the entire target assembly is formed from a single piece of target material. Typical target materials include aluminum alloy, gold, silver, copper, platinum, and titanium which are of high purity and thus are relatively expensive. A machining process is utilized to form the target assembly. However, the machining process results is a substantial amount of target material being discarded, which substantially increases manufacturing costs.

Still further types of target assemblies are described in U.S. Pat. No. 4,198,283 which is assigned to Materials Research Corporation, an assignee herein. In particular, this patent refers to a circular target which is held in a mating cup-shaped mounting fixture by frictional engagement. In addition, this patent describes another target assembly having prismatic target bars and magnetic pole pieces wherein the target bars are also held in place by frictional engagement. During operation, heat is generated that causes the target bars to become more firmly clamped due to thermal expansion. However, in order to provide the frictional engagement, precise manufacturing techniques must be utilized which are time consuming and expensive to implement.

It is an object of the present invention to provide a target assembly having enhanced structural integrity.

It is an additional object of the present invention to provide a target assembly whose structure enables the use of thicker targets.

It is a still further object of the present invention to provide a target assembly the fabrication of which substantially reduces the amount of target material that is discarded.

It is also an object of the present invention to provide a target assembly which is relatively inexpensive to fabricate.

SUMMARY OF THE INVENTION

The present invention relates to a target assembly for use in a sputtering system used for forming a thin film on a substrate. The target assembly includes a mounting element having an interior wall which defines an aperture. The target assembly further includes a target for providing material for forming the film on the substrate. In particular, the target is affixed within the mounting element by an interference fit between the aperture and the target.

BRIEF DESCRIPTION OF THE FIGURES

FIG. 8 is a cross sectional view of a sputtering system including the target assembly of the present invention.

DETAILED DESCRIPTION OF THE INVENTION

Figure 1:
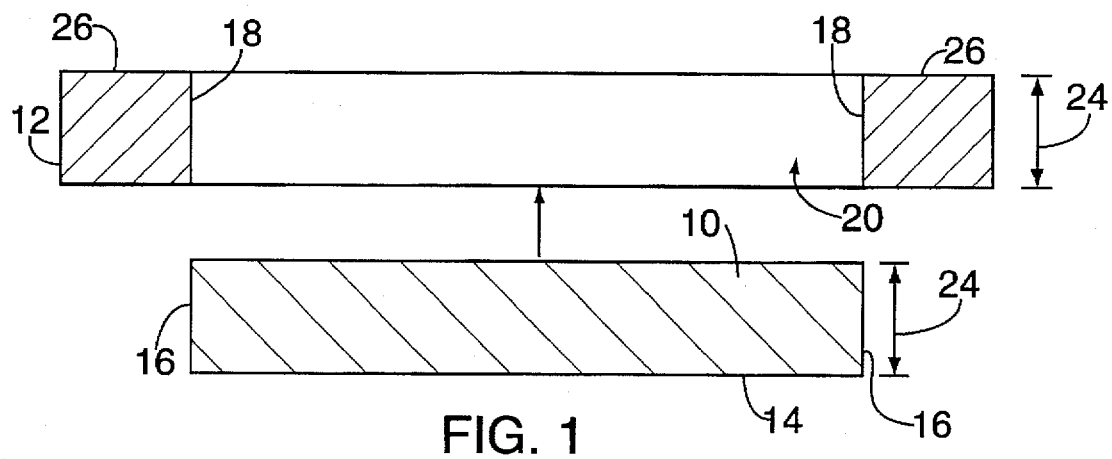
FIG. 1 is a cross sectional view of a target blank and mounting ring prior to assembly.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiment shown and described. In the description below, like reference numerals are used to described the same, similar, or corresponding parts in the several views of the drawings.

Referring to FIG. 1, cross sectional views of a target blank 10 and mounting ring 12 in accordance with the present invention are shown prior to assembly. It is noted that the present invention is applicable to sputtering systems which utilize target assemblies having flat backing plates and which do not include a recess for accommodating cathode magnets such as ENDURA™, ANELVA™, ELECTROTECH SIGMA™ and APPLIED MATERIAL™ target assemblies. The target blank 10 is fabricated from a material suitable for forming a thin film on a substrate during a sputtering process. This includes materials such as aluminum alloy, gold, silver, copper, platinum, and titanium which are of a purity suitable for the sputtering process. In a preferred embodiment, the target blank 10 is fabricated from titanium. The target blank 10 is substantially disc shaped and includes a horizontal bottom surface 14 and a vertical peripheral wall 16. The mounting ring 12 has a substantially annular shape and includes a vertical interior wall 18 for defining a circular aperture 20 which extends through the mounting ring 12. The aperture 20 is sized smaller than the target blank 10 by an amount sufficient for forming an interference fit between the target blank 10 and the aperture 20. In one embodiment, the outer diameter of the target blank 10 is approximately 13.572 inches and the diameter of the aperture 20 is approximately 13.558 inches. Further, the mounting ring 12 includes a cover mounting surface 26 adapted for being mounted to a chamber cover as will be described. In addition, the mounting ring 12 and the target blank 10 each have a first thickness 24.

Figure 2:
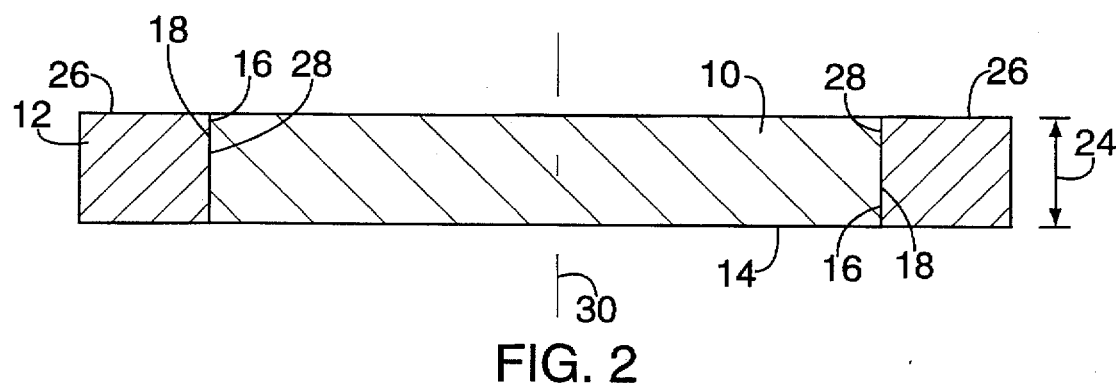
FIG. 2 is a cross sectional view of the mounting ring after being shrunk fit around the target blank.

Referring to FIG. 2 in conjunction with FIG. 1, the target blank 10 is shown assembled within the mounting ring 12. In accordance with the present invention, the mounting ring 12 is heated in an oven to a temperature sufficient for expanding the aperture 20 to a size suitable for accommodating the target blank 10. The target blank 10 is then inserted within the aperture 20 such that the peripheral wall 16 is adjacent to the interior wall 18. The mounting ring 12 is then allowed to cool to room temperature, thus contracting the mounting ring 12 and the aperture 20. This forms an interference fit between the target blank 10 and the aperture 20 which affixes the target blank 10 within the mounting ring 12 and forms an integrated assembly. As a result, a first interface 28 is formed between the peripheral 16 and interior 18 walls which is substantially parallel to a center axis 30 of the target blank 10. Further, the target blank 10 and the aperture 20 are configured such that the interference fit is maintained during the sputtering process. In addition, it is noted that the mounting ring 12 may be fabricated from the same material as the target blank 10 or alternatively, from a different material than the target blank 10 suitable for forming and maintaining the interference fit. It is noted further that the use of an interference fit enables the use of manufacturing techniques having substantially reduced cost than the manufacturing techniques which are required to provide frictional engagement.

Figure 3:
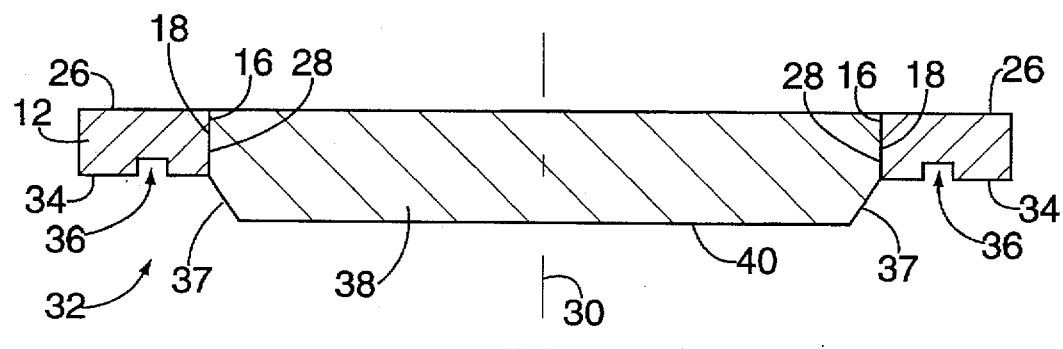
FIG. 3 is a cross sectional view of a target assembly in accordance with the present invention.

Referring to FIG. 3 in conjunction with FIGS. 1 and 2, a target assembly 32 in accordance with the present invention is shown. Material is removed from a bottom portion of the mounting ring 12 to reduce the thickness of the mounting ring 12 to a second thickness, thus forming a chamber mounting surface 34. A groove 36 for accommodating a sealing element such as an O-ring is formed on the chamber mounting surface 34. As will be described, the O-ring serves to maintain a vacuum which is suitable for the sputtering process. Further, material is removed from a portion of the peripheral wall 16 which extends below the chamber mounting surface 34 such that a side wall 37 is formed that tapers toward the bottom surface 14. This forms a target 38 having a sputtering surface 40 from which material for forming a thin film on a substrate is removed. Thus, an integrated target assembly is formed. Therefore, upon depletion of the target 38 due to the sputtering process, the entire target assembly 32 may then be replaced. It has been found that utilizing an interference fit to affix the target 38 within the mounting ring 12 results in a substantially reduced likelihood of structural failure. In addition, the present invention enables the use of a target 38 having a substantially greater target thickness than that which is structurally allowable by a bond formed as a result of either a diffusion or solid state bonding process. This increases the usable life of the target assembly 32, thus reducing the frequency with which the target assembly 32 must be replaced and results in lower manufacturing costs. Further, the amount of target material which is discarded is reduced, thus further reducing manufacturing costs.

Figure 4A:
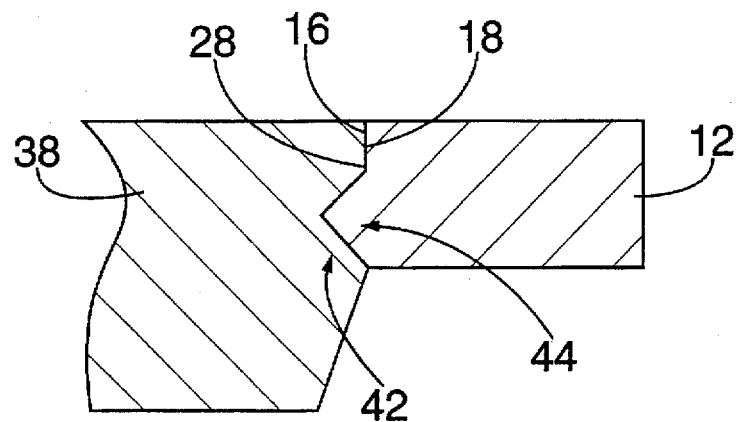
FIGS. 4A–4C show alternate embodiments for an interface between a target and the mounting ring.
Figure 4B:
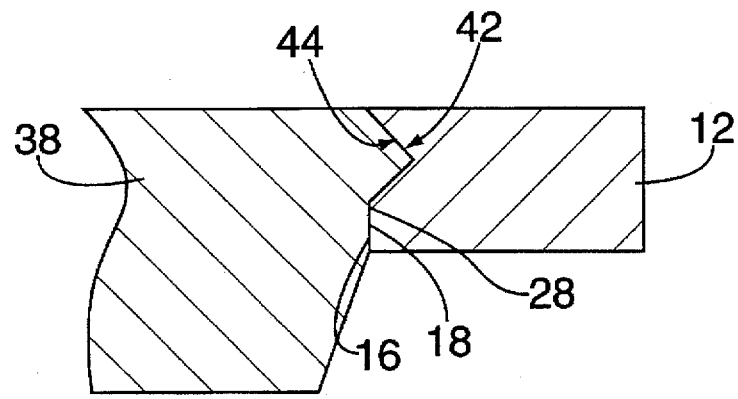
Figure 4C:
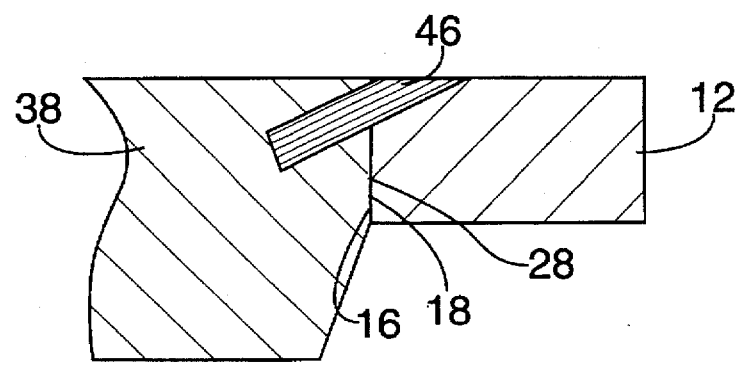

Referring to FIGS. 4A–4C, alternate embodiments for the first interface 28 are shown in enlarged views. In particular, each of the embodiments depicted in FIGS. 4A–4C enhance the structural integrity of the target assembly 32. In FIG. 4A, a first alternate embodiment is shown wherein the peripheral wall 16 includes a notch 42 and the interior wall 18 includes a projection 44 which mates with the notch 42, thus capturing the target 38. In FIG. 4B, a second alternate embodiment is shown wherein the interior wall 18 includes the notch 42 and the peripheral wall 16 includes the projection 44, thus capturing the mounting ring 12. Referring to FIG. 4C, a third alternate embodiment is shown wherein at least one pin element 46 extends through the peripheral 16 and interior 18 walls, thus capturing both the target 38 and the mounting ring 12. By way of example, three pin elements spaced 120 degrees relative to each other may be used.

Figure 5:
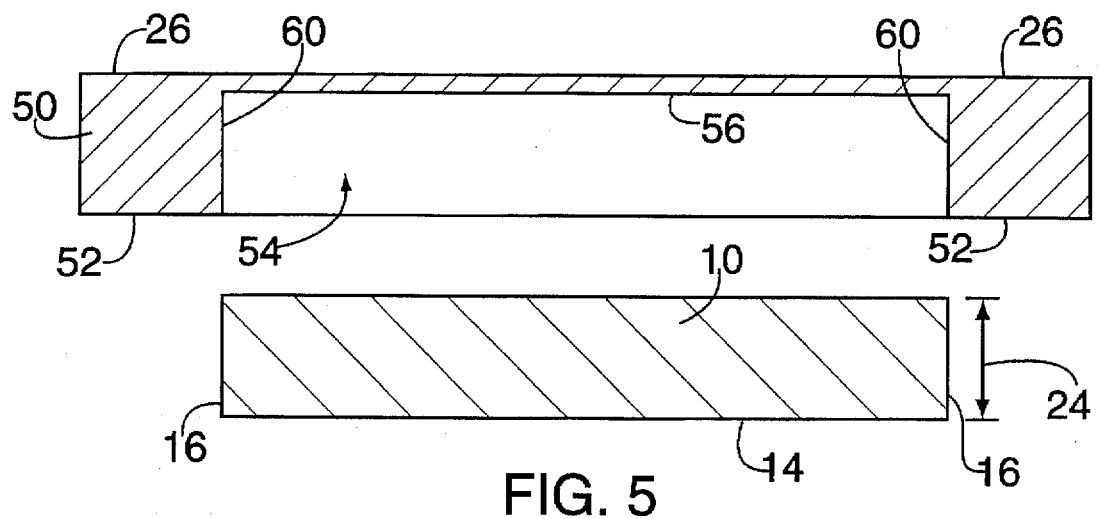
FIG. 5 is a cross sectional view of the target blank and a baseplate prior to assembly.
Figure 6:
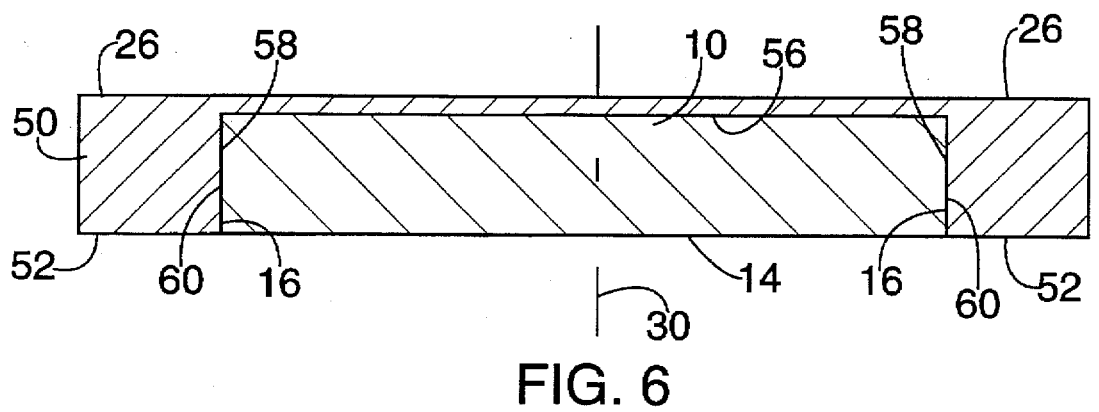
FIG. 6 is a cross sectional view of the baseplate after being shrunk fit around the target blank.
Figure 7:
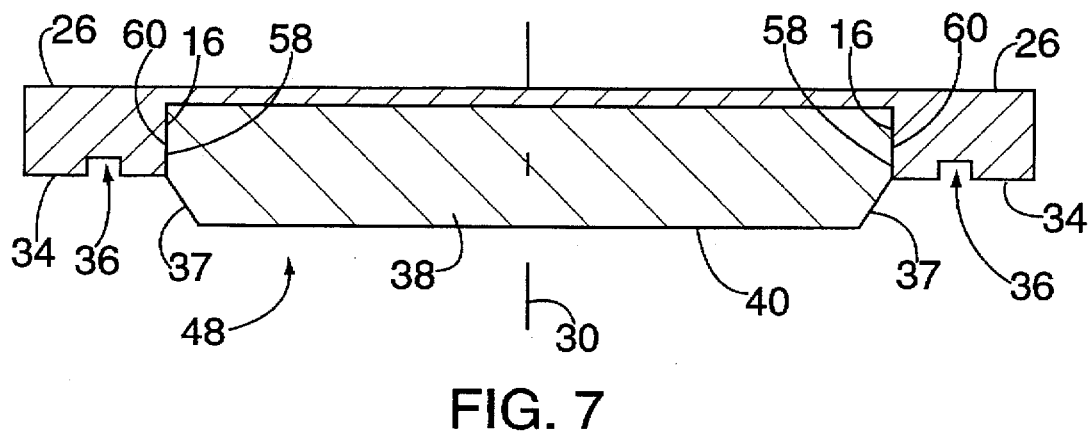
FIG. 7 is a cross sectional view of a target assembly in accordance with the present invention.

An alternate embodiment for the target assembly 32 will now be described. Referring to FIGS. 5–7, a cross sectional view of a baseplate 50 and the target blank 10 is shown. The baseplate 50 is substantially disc shaped and includes a baseplate bottom surface 52 having a circular bore 54 which extends partially into the baseplate 50 and terminates at a base surface 56. The bore 54 is defined by a baseplate inner wall 60 and is sized smaller than the target blank 10 by an amount sufficient for forming an interference fit between the target blank 10 and the bore 54. Further, the baseplate 50 includes the cover mounting surface 26. As described previously in relation to FIGS. 1–3, the baseplate 50 is heated in an oven to a temperature sufficient for expanding the bore 54 to a size suitable for accommodating the target blank 10. The target blank 10 is then inserted into the bore 54 such that the peripheral wall 16 is adjacent to the baseplate inner wall 60. The baseplate 50 is then allowed to cool to room temperature, thus contracting the baseplate 50 and the bore 54. This forms an interference fit between the target blank 10 and the aperture 54 which affixes the target blank 10 within the baseplate 50 at a second interface 58. Material is then removed from the baseplate 50 to form the chamber mounting surface 34 and the groove 36. In addition, material is removed from the target blank 10 so as to form the tapered side wall 37 and sputtering surface 40. Referring to FIG. 7, this results in the formation of the target 38 and an alternate target assembly 48. Further, it is noted that the alternate configurations described in FIGS. 4A–4C may also be used to enhance the structural integrity of the alternate target assembly 48.

Referring to FIG. 8, a cross sectional view is shown of a sputtering system 62 employing the target assembly 32, although it is noted that the alternate target assembly 48 may also be used. The sputtering system 62 includes a chamber 64 having an outer surface 66 and a cavity 68. A hole 70 is formed through the outer surface 66 and extends into the cavity 68. The target assembly 32 is oriented such that the target 38 extends through the hole 70 and the sputtering surface 40 faces downward into the cavity 68. In accordance with the present invention, the target assembly 32 serves as a cathode. An O-ring 72 is positioned within groove 36 and contacts the outer surface 66 to seal the cavity 68 so as to maintain a vacuum within the cavity 68. The target assembly 32 further includes a chamber cover 74 which is removably affixed to the cover mounting surface 26. A clamping mechanism (not shown) is utilized to clamp the chamber cover 74 and thus the target assembly 32 to the chamber 64. The chamber 64 further includes a substrate 76 which is positioned opposite the sputtering surface 40 and which is supported by an anode 78. In operation, the cavity 68 is maintained at a vacuum level suitable for sputtering and an inert gas, such as argon, is introduced into the cavity 68 between the sputtering surface 40 and the substrate 76. A high DC or AC voltage is then applied to the target assembly 32 to cause the formation of a plasma discharge having positively charged ions which bombard the sputtering surface 40. This causes target material to be removed from the sputtering surface 40, thus initiating a sputtering process wherein target material is deposited onto the substrate 76 to form the film. Upon depletion of the target material, the target assembly 32 is replaced.

Thus, it is apparent that in accordance with the present invention, an apparatus that fully satisfies the objectives, aims and advantages is set forth above. While the invention has been described in conjunction with the specific embodiments, it is evident that many alternatives, modifications, permutations and variations will become apparent to those skilled in the art in light of the forgoing description. Accordingly, it is intended that the present invention embrace all such alternatives, modifications and variations as fall within the scope of the appended claims.

What is claimed is:

1. A target assembly for use in a sputtering system used for forming a film on a substrate, comprising:
   a mounting element having an interior wall for defining an aperture;
   a target for providing material for forming said film on said substrate, wherein said target includes a peripheral wall and is affixed within said mounting element by an interference fit between said peripheral and interior walls and wherein said interference fit is formed at room temperature and is maintained during operation of said sputtering system; and
   at least one pin element extending through said peripheral and interior walls and into said target and said mounting element, respectively, for strengthening said interference fit.

2. A target assembly according to claim 1, wherein said peripheral wall includes a projection and said interior wall includes a notch for receiving said projection.

3. A target assembly according to claim 1, wherein said interior wall includes a projection and said peripheral wall includes a notch for receiving said projection.

4. A target assembly according to claim 1, wherein said mounting element includes a groove for holding a sealing element.

5. A target assembly according to claim 4, wherein said groove is formed for holding an O-ring sealing element.

6. A target assembly according to claim 1, wherein said target is fabricated from titanium.

7. A method of forming a target assembly used for forming a film on a substrate, comprising the steps of:
   providing a target which provides material for forming said film, said target having a peripheral wall;
   providing a mounting element having an interior wall which forms an aperture, wherein said aperture is sized smaller than said target;
   heating said mounting element to enlarge said aperture to a size suitable for accommodating said target;
   placing said target within said aperture;
   shrink fitting said mounting ring around said mounting element by allowing said mounting element to cool to room temperature; and
   affixing a pin element through said peripheral and interior walls and into said target and said mounting element, respectively, for strengthening said interference fit.

8. The method according to claim 7, further including the step of providing a projection in said peripheral wall and a notch in said interior wall for receiving said projection.

9. The method according to claim 7, further including the step of providing a projection in said interior wall and a notch in said peripheral wall for receiving said projection.

10. The method according to claim 7, further including the step of providing a groove in said mounting element for holding a sealing element.

11. A sputtering system for forming a thin film on a substrate, comprising:
   a chamber having a chamber wall for defining a cavity, said chamber wall including an outer surface and a hole;
   a mounting element having an interior wall for defining an aperture, said mounting element further including a sealing element for maintaining a vacuum in said cavity and wherein said sealing element contacts said outer wall;
   a target for providing material for forming said film on said substrate, wherein said target includes a peripheral wall and is affixed within said mounting element by an interference fit between said peripheral and interior walls thereby forming a target element, wherein said target extends through said hole and faces downward into said cavity and wherein said interference fit is formed at room temperature and is maintained during operation of said sputtering system;
   at least one pin element extending through said peripheral and interior walls and into said target and said mounting element, respectively, for strengthening said interference fit; and
   a support element for supporting said substrate in a position opposite said target within said cavity to enable formation of said film.

12. A target assembly according to claim 11, wherein said peripheral wall includes a projection and said interior wall includes a notch for receiving said projection.

13. A target assembly according to claim 11, wherein said interior wall includes a projection and said peripheral wall includes a notch for receiving said projection.

14. A target assembly according to claim 11, wherein said mounting element includes a groove for holding a sealing element.

15. A target assembly according to claim 11, wherein said target is fabricated from titanium.

* * * * *